United States Patent
Ota et al.

(10) Patent No.: US 6,259,122 B1
(45) Date of Patent: Jul. 10, 2001

(54) GROUP III NITRIDE SEMICONDUCTOR LIGHT-EMITTING DEVICE HAVING ANTICRACKING FEATURE

(75) Inventors: Hiroyuki Ota; Toshiyuki Tanaka; Atsushi Watanabe, all of Tsurugashima (JP)

(73) Assignee: Pioneer Corporation, Tokyo (JP)

(*) Notice: Subject to any disclaimer, the term of this patent is extended or adjusted under 35 U.S.C. 154(b) by 0 days.

(21) Appl. No.: 09/368,535

(22) Filed: Aug. 4, 1999

(30) Foreign Application Priority Data

Aug. 7, 1998 (JP) .................................. 10-224891

(51) Int. Cl.$^7$ .................................. H01L 33/00
(52) U.S. Cl. .................. 257/101; 257/102; 257/103
(58) Field of Search .................. 257/12, 13, 22, 257/94, 96, 101, 102, 103; 372/43, 45

(56) References Cited

U.S. PATENT DOCUMENTS 5,496,766 * 3/1996 Amano et al. .................. 438/37
5,583,879 * 12/1996 Yamazaki et al. .................. 372/45

* cited by examiner

Primary Examiner—Minh Loan Tran
(74) Attorney, Agent, or Firm—Perman & Green, LLP

(57) ABSTRACT

In a semiconductor light-emitting device having a multilayered structure which consists essentially of layers of Group III nitride semiconductors $(Al_xGa_{1-x})_{1-y}In_yN$ ($0 \leq x \leq 1$, $0 \leq y \leq 1$) which are different from each other in chemical composition ratio, generation of cracks at an interface propagating from an interface between adjacent layers is prevented. Two adjacent layers within the multilayered structure, which include a lower layer having a lattice constant larger than a lattice constant of an upper layer of the two adjacent layers, have a portion close to the interface of the two adjacent layers doped such that an element different from the Group III nitride semiconductors is added in a higher concentration, i.e. in a higher distribution density than in other portions thereof.

8 Claims, 1 Drawing Sheet

FIGURE
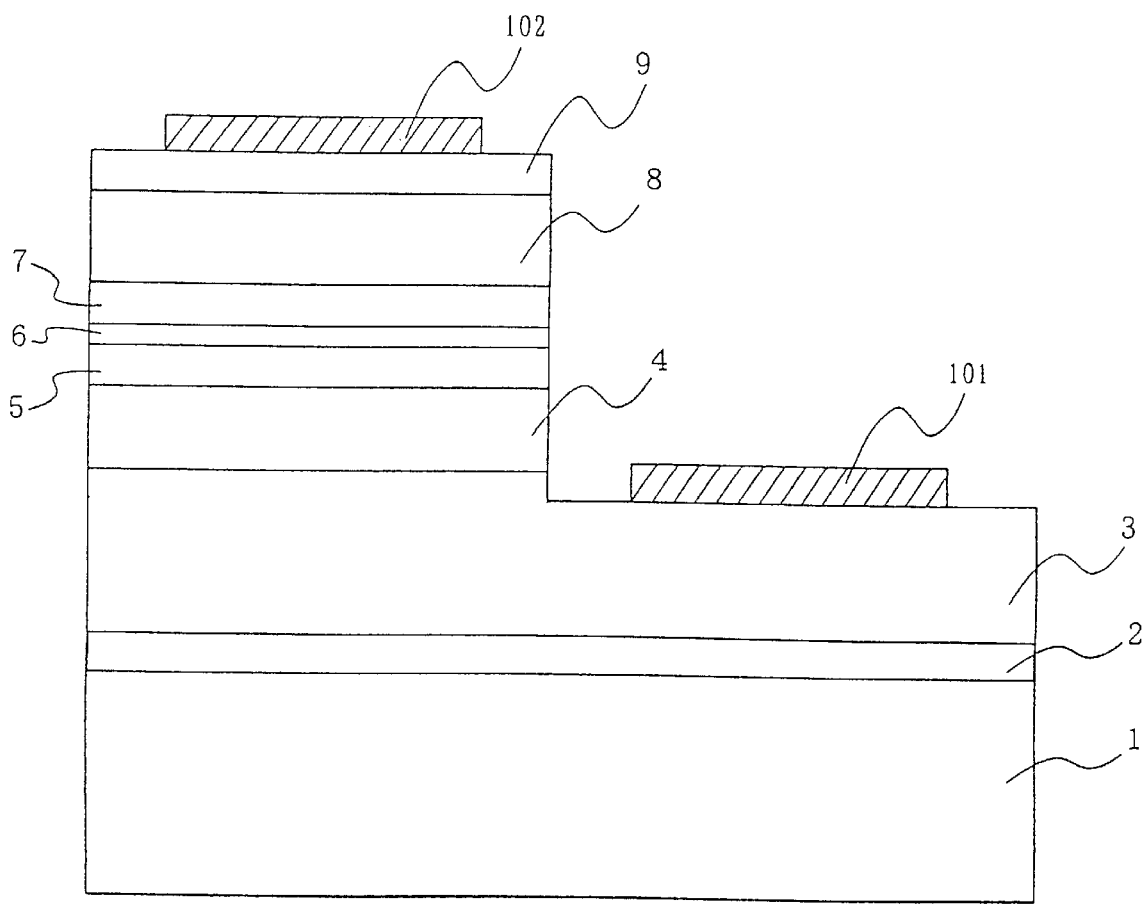

GROUP III NITRIDE SEMICONDUCTOR LIGHT-EMITTING DEVICE HAVING ANTICRACKING FEATURE

BACKGROUND OF THE INVENTION

1. Field of the Invention

This invention relates to a Group III nitride semiconductor light-emitting device, and more particularly to a method of forming single crystal films for use in the light-emitting device.

2. Description of the Related Art

In the manufacturing of a light-emitting device using semiconductors, such as a light-emitting diode (LED) and a laser diode (LD), semiconductor layers with varied forbidden band width (hereinafter simply referred to as "band gap" or "$E_g$") are formed one upon another to form a basic structure of the device. In a Group III nitride semiconductor light-emitting device according to the present invention, x and y values of $(Al_xGa_{1-x})_{1-y}In_yN$ ($0 \leq x1$, $0 \leq y \leq 1$) are varied to thereby change values of the band gap.

FIG. 1 shows an example of the basic structure of a laser diode device using Group III nitride semiconductors, in which a GaN or AlN layer 2 is formed on a single crystal sapphire substrate 1 at a low temperature, and then on the layer 2, an n-type GaN layer 3, an n-type $Al_{0.1}Ga_{0.9}N$ layer 4, an n-type GaN layer 5, an active layer 6 having InGaN as a major constituent thereof, a p-type GaN layer 7, a p-type $Al_{0.1}Ga_{0.9}N$ layer 8, and a p-type GaN layer 9 are formed one upon another in the mentioned order. An n-type electrode 101 and a p-type electrode 102 are formed on the n-type GaN layer 3 and the p-type GaN layer 9, respectively.

In this laser diode device constructed as above, light is emitted by electron-hole recombination in the active layer 6. The n-type GaN layer 5 and the p-type GaN layer 7 are guide layers, within which light generated in the active layer 6 is waveguided. Further, it is possible to confine electrons and holes within the active layer 6 effectively by setting the band gap of each of the guide layers to be larger than that of the active layer 6. The n-type $Al_{0.1}Ga_{0.9}N$ layer 4 and the p-type $Al_{0.1}Ga_{0.9}N$ layer 8 are clad layers having a refractive index which is lower than that of the p-type GaN layer 7, and the aforementioned waveguiding of the light is effected by the difference between the refractive index of the clad layers and that of the guide layers.

The n-type GaN layer 3 is an underlying layer which provides a current path because the sapphire substrate has no conductivity. Further, the low-temperature growth layer 2, so-called a buffer layer, is formed for producing a smooth GaN film on the sapphire substrate which is a dissimilar material to GaN.

In the Group III nitride semiconductors $(Al_xGa_{1-x})_{1-y}In_yN$ ($0 \leq x \leq 1$, $0 \leq y \leq 1$), considering GaN is a basic binary compound, it is possible to replace part of the Ga atoms with Al atoms by doping the compound with Al to thereby increase the band gap of the same. Further, it is possible to replace part of the Ga atoms with In atoms by doping the compound with In to thereby decrease the band of the same. As the value of the band gap becomes larger, the refractive index is reduced.

In an $Al_zGa_{1-z}As/GaAs$ system used in a laser diode operative in the infrared region, a lattice constant thereof hardly changes irrespective of the z value, whereas in the Group III nitride semiconductors $(Al_xGa_{1-x})_{1-y}In_yN$ ($0 \leq x \leq 1$, $0 \leq y \leq 1$), if the x and y values are varied, a lattice constant thereof changes sharply. This difference results from the fact that in the case of $Al_zGa_{1-z}As$ system, the lattice constant of GaAs and that of AlAs are approximately equal to each other, so that no lattice mismatch occurs.

In the manufacturing of the semiconductor device described above by using Group III nitride semiconductors $(Al_xGa_{1-x})_{1-y}In_yN$ ($0 \leq x \leq 1$, $0 \leq y \leq 1$), cracking (or crazing) occurs during formation of the n-type AlGaN layer 4. The lattice constant of AlN is smaller than that of GaN by approximately 2.4% in a-axis direction, so that when the AlGaN-clad layer 4 is formed on the GaN underlying layer 3, tensile stress is generated paralell to the interface between the two layers 3 and 4. In general, a semiconductor crystal is resistant to compressive stress, but brittle to tensile stress. For this reason, cracking occurs very easily in the AlGaN-clad layer 4.

This cracking in the AlGaN-clad layer 4 propagates through the underlying layer 3 as well as through the guide layer 5 formed on the AlGaN-clad layer 4. A laser diode is a device which is operated by guiding optical waves (i.e. by waveguiding light) within a layered structure thereof. Therefore, the cracking can fatally affect the characteristics of the device.

SUMMARY OF THE INVENTION

An object of the present invention is to provide a semiconductor light-emitting device having a multilayered structure constructed by sequentially forming layers of Group III nitride semiconductors one upon another such that cracking at the interface region of said multilayered structure is prevented, thereby maintaining an excellent optical property of the device, and a method of manufacturing the device.

To attain the object, according to a first aspect of the a invention, there is provided a semiconductor light-emitting device having a multilayered structure formed by sequentially forming layers of Group III nitride semiconductors $(Al_xGa_{1-x})_{1-y}In_yN$ ($0 \leq x \leq 1$, $0 \leq y \leq 1$) which are different from each other in chemical composition ratio, one upon another, on a substrate.

This semiconductor light-emitting device is characterized in that two adjacent layers within the multilayered structure, which include a lower layer having a lattice constant larger than a lattice constant of an upper layer, have a portion close to an interface of the two adjacent layers doped such that an element different from the Group III nitride semiconductors is added to the portion in a higher concentration, i.e. in a higher distribution density than in other portions of the two adjacent layers.

To attain the object, according to a second aspect of the invention, there is provided a method of manufacturing a semiconductor light-emitting device having a multilayered structure formed by sequentially forming layers of Group III nitride semiconductors $(Al_xGa_{1-x})_{1-y}In_yN$ ($0 \leq x \leq 1$, $0 \leq y \leq 1$) which are different from each other in chemical composition ratio, one upon another, on a substrate by a metal-organic chemical vapor deposition method.

This method is characterized by comprising: a first film-forming step of forming a first crystal layer; a second film-forming step for forming a second crystal layer on the first crystal layer, the second crystal layer having a lattice constant which is smaller than a lattice constant of the first crystal layer; and an impurity-adsorbing step carried out before the second film-forming step, for causing an element different from the Group III nitride semiconductors to be adsorbed onto the surface of the first crystal layer.

To attain the object, according to a third aspect of the invention, there is provided a method of manufacturing a semiconductor light-emitting device having a multilayered structure formed by sequentially forming layers of Group III nitride semiconductors $(Al_xGa_{1-x})_{1-y}In_yN$ ($0 \leq x \leq 1$, $0 \leq y \leq 1$) which are different from each other in chemical composition ratio, one upon another, on a substrate by metal-organic chemical vapor deposition method.

This method is characterized by comprising: a first film-forming step of forming a first crystal layer; and a second film-forming step of forming a second crystal layer on the first crystal layer, the second crystal layer having a lattice constant which is smaller than a lattice constant of the first crystal layer, the second film-forming step including an impurity-doping step of adding a dopant gas to a source gas at an initial stage of the second film-forming step such that concentration of the dopant gas in the source gas becomes higher than in the first film-forming step, and then reducing the concentration of the dopant gas in the source gas.

According to the invention, in the multilayered structure of the Group III nitride semiconductor light-emitting device, an element different from the Group III nitride semiconductors is added to a portion close to an interface between two adjacent layers having such a lattice mismatch that a lower layer has a lattice constant larger than that of an upper layer adjacent thereto, thereby causing three-dimensional growth at the initial stage of the formation of the upper layer. Dislocations induced by the three-dimensional growth relax the strain caused by the lattice mismatch, whereby occurrence of cracking is prevented even after the growth of the upper layer proceeds from the three-dimensional growth stage to a two-dimensional growth stage. Therefore, the invention can provide a semiconductor device having excellent optical characteristics.

It should be noted that the application of the present invention is not limited to the forming of films on a sapphire substrate. The invention can be applied not only to forming of films on a insulating substrate such as $MgAl_2O_4$ (spinel), LGO (lithium gallate), etc., but also to forming of films on a GaN bulk crystal substrate.

Further, the invention is applicable even if films are formed of other substances than n-type GaN and n-type AlGaN. The invention is also applicable even if the films are p-type or are insulating.

Only when the adjacent layers have some conduction type, and at the same time it is required to pass electric current across the interface between the two layers, the element introduced into the interface is required to match the conduction type.

More specifically, for an interface between two n-type films, e.g. an n-type AlGaN film and an n-type GaN film, it is possible to select a donor-type element such as Si or Ge belonging to the Group IV or O or S belonging to the Group VI, while for an interface between two p-type films, e.g. a p-type AlGaN film and a p-type GaN film, an acceptor-type element such as Be or Mg belonging to the Group II or C belonging to the Group IV may be selected.

According to the present invention, since it is possible to prevent occurrence of cracking, an excellent optical property can be obtained.

BRIEF DESCRIPTION OF THE DRAWING

FIG. 1 is a cross-sectional view showing an example of structure of a Group III nitride semiconductor light-emitting device.

DETAILED DESCRIPTION OF THE PREFERRED EMBODIMENT

The invention will be described in further detail based on Examples.

EXAMPLE 1

A sapphire substrate 1 was placed into an MOCVD growth reactor for use in forming films by the MOCVD (metal-organic chemical vapor deposition) method and held for 10 minutes in a stream of hydrogen gas having a pressure of 300 Torr at 1050° C., to have surface thereof thermally cleaned.

Then, the sapphire substrate 1 was cooled to 600° C., and 2 SLM (standard liter per minute) of $NH_3$, which is a nitrogen source compound, and 25 μmol/min of TMA (trimethylaluminum), which is an aluminum source compound, were introduced into the reactor, whereby an AlN buffer layer 2 was formed to have a thickness of 20 nm.

Subsequently, the supply of TMA was stopped, and the temperature of the sapphire substrate 1 with the buffer layer 2 formed thereon was raised again to 1050° C. with only $NH_3$ being fed into the reactor. Further, 120 μmol/min of TMG (trimethylgallium) was introduced into the reactor to form an n-type GaN underlying layer 3. During this step, 9 nmol/min of Me-$SiH_3$ (methylsilane) was added to the growth ambient gas as an n-type dopant.

When the n-type GaN underlying layer 3 was grown by approximately 3 μm, the supply of TMG alone was stopped. On the other hand, the supply of the n-type dopant gas Me-$SiH_3$ was increased up to 75 nmol/min and continued. After this state was maintained for 5 minutes, the supply of Me-$SiH_3$ was decreased to 3 nmol/min, and 36 μmol/min of TMG as well as 4 μmol/min of TMA were simultaneously introduced again to form an n-type AlGaN layer 4.

When the n-type AlGaN layer 4 was grown by approximately 0.5 μm, the supply of TMG, TMA, and Me-$SiH_3$ was stopped, and lowering of the temperature was started. When the temperature of the substrate fell below 400° C., the supply of $NH_3$ was also stopped. Then, the product thus formed was taken out from the reactor when the temperature thereof becomes equal to room temperature. Thus, an element different from said Group III nitride semiconductors is added to the portion at a higher concentration, i.e. at a distribution density higher than in other portions of the two adjacent layers.

The films formed as above were inspected by using an optical microscope, and found to have no crack. On the other hand, a sample which was not subjected to the 5-minute treatment by continued supply of the n-type dopant gas described above was found to have cracks all over.

Further, evaluation performed on these samples by using an X-ray diffractometer showed that an Al mix crystal ratio (x value) of n-type $Al_xGa_{1-x}N$ was equal to 0.1.

Conduction checks were performed on the sample of n-type $Al_xGa_{1-x}N$ formed without any cracks after removing a portion of n-type AlGaN layer 4 by RIE (reactive ion etching) and depositing Ti/Al electrodes on an exposed surface of the n-type GaN layer 3 and a surface of the n-type AlGaN layer 4, respectively, and it was verified that the sample had a low-resistance ohmic property and there existed no high-resistance layer or the like at the interface between the two layers 3 and 4. This results from the fact that Si which is a dopant adsorbed onto the surface of the GaN layer acts as a donor in GaN.

EXAMPLE 2

A sapphire substrate 1 was placed into the MOCVD growth reactor and held for 10 minutes in a stream of hydrogen gas having a pressure of 300 Torr at 1050° C., to have surface thereof thermally cleaned.

Then, the sapphire substrate 1 was cooled to 600° C., and 2 SLM of $NH_3$, which is a nitrogen source compound, and 25 Umol/min of TMA, which is an aluminum source compound, were introduced into the growth reactor, whereby an AlN buffer layer 2 was formed to have a thickness of 20 nm.

Subsequently, the supply of TMA was stopped, and the temperature of the sapphire substrate 1 with the buffer layer 2 formed thereon was raised again to 1050° C. with only $NH_3$ being fed into the reactor. Further, 120 μmol/min of TMG was introduced into the reactor to form an n-type GaN underlying layer 3. During this step, 9 nmol/min of Me-$SiH_3$ was added to the growth ambient as an n-type dopant.

When the n-type GaN underlying layer 3 was grown by approximately 3 μm, the supply of TMG and Me-$SiH_3$ alone was stopped, and lowering of the temperature was started. When the temperature of the substrate 1 fell below 400° C., the supply of $NH_3$ was also stopped. Then, the product thus formed was taken out from the reactor when the temperature thereof becomes equal to room temperature.

After it was verified that there was no flaw in the n-type GaN underlying layer 3, the substrate 1 was placed again in the MOCVD growth reactor. Then, the temperature of the substrate 1 was raised again to 1050° C. with 2 SLM of $NH_3$ being fed into the reactor, and 36 μmol/min of TMG, 4 μmol/min of TMA, and 3 nmol/min of Me-$SiH_3$ were introduced to form an n-type AlGaN layer 4. When the n-type AlGaN layer 4 was grown by approximately 0.5 μm, the supply of TMG, TMA, and Me-$SiH_3$ was stopped, and lowering of the temperature was started. When the temperature of the substrate 1 fell below 40020 C., the supply of $NH_3$ was also stopped. Then, the product thus formed was taken out from the reactor when the temperature thereof became equal to room temperature.

The films formed as above were inspected by using an optical microscope, and found to have no crack. In another experiment for comparison, after the substrate 1 with its n-type GaN underlying layer 3 exposed to the atmosphere was placed again in the MOCVD growth reactor, and the temperature of the substrate was raised to 1050° C. with 2 SLM of $NH_3$ being fed into the reactor. The substrate was held in this state for 20 minutes, followed by introducing TMG, TMA, and Me-$SiH_3$ into the reactor to form the n-type AlGaN layer 4. In this case, cracks were detected in the formed films. Further, evaluation performed on these samples by using an X-ray diffractometer showed that the Al mix crystal ratio (x value) of n-type $Al,Ga_1N$ was equal to 0.1.

Similar to Example 1, conduction checks were performed on the sample having no cracks after removing a portion of the n-type AlGaN layer 4 by RIE (reactive ion etching) and depositing Ti/Al electrodes on an exposed surface of the n-type GaN layer 3 and a surface of the n-type AlGaN layer 4, respectively, and it was verified that the sample had low-resistance ohmic property and there existed no high-resistance layer or the like at interface between the two layers 3 and 4 in Example 2. This results from the fact that an absorbate absorbed in the n-type GaN layer was oxygen, which acts in GaN as a shallow donor.

In Example 2, oxygen was adsorbed from the atmosphere onto the surface of the n-type GaN layer, and this provided substantially the same effects as obtained in Example 1. If the n-type GaN layer is held in a stream of gas containing $NH_3$ at 1050° C. for 20 minutes, the absorption layer was removed, and hence cracking occurs. The degree of surface coverage of the adsorption layer when the AlGaN layer starts to be formed is dependent on the following factors: conditions under which the n-type GaN layer is exposed to the atmosphere, and conditions under which the n-type GaN layer is baked in $NH_3$ immediately before the AlGaN layer starts to be formed. Since the oxygen in the atmosphere is in a stable molecular state and room temperature is relatively low, oxygen adsorbed from the atmosphere becomes saturated in relatively short time. Therefore, adsorption of oxygen from the atmosphere (which is substantially equivalent to formation of an oxide film) is performed in a relatively stable state.

However, if heating is carried out during the exposure of the n-GaN layer to the atmosphere, or surface oxidation is promoted by chemical reaction, the effects obtained from Example 2 can be enhanced. Under the conditions of the reactor used, the gases, and the processing temperatures in this example, the time period for baking in $NH_3$ was required to be limited to 10 minutes or shorter so as to obtain a sufficient effect of preventing cracking.

EXAMPLE 3

A sapphire substrate 1 was placed into the MOCVD growth reactor and held for 10 minutes in a stream of hydrogen gas having a pressure of 300 Torr at 1050° C., to have surface thereof thermally cleaned.

Then, the sapphire substrate 1 was cooled to 600° C., and 2 SLM of $NH_3$, which is a nitrogen source compound, and 25 μmol/min of TMA, which is an aluminum source compound, were introduced into the growth reactor, whereby an AlN buffer layer 2 was formed to have a thickness of 20 nm.

Subsequently, the supply of TMA was stopped, and the temperature of the sapphire substrate 1 with the buffer layer 2 formed thereon was raised again to 1050° C. with only $NH_3$ being fed into the reactor. Further, 120 μmol/min of TMG was introduced into the reactor to form an n-type GaN underlying layer 3. During this process, 9 nmol/min of Me-$SiH_3$ was added to the growth ambient gas as an n-type dopant.

When the n-type GaN underlying layer 3 was grown by approximately 3 μm, the supply of Me-$SiH_3$ was increased to 13 nmol/min, and the flow rate of TMG was changed to 36 μmol/min. At the same time, 4 mol/min of TMA was introduced to form a first n-type AlGaN layer 4.

When the first n-type AlGaN layer 4 was grown by approximately 0.1 μm, the flow rate of Me-$SiH_3$ was decreased to 3 nmol/min, and then a second n-type AlGaN layer 4 was formed. When the total thickness of the first and second n-type AlGaN layers reaches approximately 0.5 μm, the supply of TMG, TMA, and Me-$SiH_3$ was stopped, and lowering of the temperature was started.

When the temperature of the substrate 1 fell below 400° C., the supply of $NH_3$ was also stopped. Then, the substrate 1 with the nitride layers theron was taken out from the reactor when the temperature thereof became equal to room temperature.

The films formed as above were inspected by using an optical microscope and found to have almost no cracks except in a portion around the periphery of the 2-inch substrate. Further, evaluation performed on the sample by using an X-ray diffractometer showed that the Al mix crystal ratio (x value) of n-type $Al_xGa_{1-x}N$ was equal to 0.1.

Conduction checks were performed on the sample having no cracks after removing a portion of the n-type AlGaN layer 4 by RIE, and depositing Ti/Al electrodes, respectively, on an exposed surface of the n-type GaN layer 3 and a surface of the second n-type AlGaN layer 4, and it was verified that the sample had low-resistance ohmic property and there existed no high-resistance layer or the like at the interface between the layers 3 and 4.

In general, a semiconductor crystal doped with a large amount of dopant suffers from degradation of quality of the surface thereof, so that an upper limit of the amount of dopant is set to avoid the degradation of the surface which prohibits two-dimensional even growth of a layer. In Example 3, doping of excessively dense Si would cause the AlGaN layer to grow three-dimensionally at its initial growth stage.

Further, the Si concentration of 2E19/cc is required to effectively prevent occurrence of cracking. If the thickness (preset mean film thickness) of the high density doping layer is below 100 angstrom, sufficient effects cannot be obtained. On the other hand, if the doping layer is thicker than 0.1 $\mu$m when a final thickness of the AlGaN-clad layer is set to be 0.5 $\mu$m, the growth of the AlGaN-clad layer is unfavorably completed before its flatness is recovered.

What is claimed is:

1. A semiconductor light-emitting device having a multilayered structure formed by sequentially forming layers of Group III nitride semiconductors $(Al_xGa_{1-x})_{1-y}In_yN$ ($0 \leq y \leq 1$) which are different from each other in chemical composition ration, one upon another, on a substrate.

wherein two adjacent layers within said multilayered structure, which include a lower layer having a lattice constant larger than a lattice of an upper layers of said two adjacent layers, have a portion close to an interface of said two adjacent layers doped such that an element different from said Group III nitride semiconductors is added to said portion at a concentration higher than that in other portions of said two adjacent layers.

2. The semiconductor light-emitting device according to claim 1, wherein said element is electrically active.

3. The semiconductor light-emitting device according to claim 2, wherein said element has donor properties or acceptor properties.

4. The semiconductor light-emitting device according to claim 3, wherein said element having said donor properties is an element belonging to Group IV or VI.

5. The semiconductor light-emitting device according to claim 3, wherein said element having said acceptor properties is an element belonging to Group II or IV.

6. The semiconductor light-emitting device according to claim 1, wherein said element has donor properties or acceptor properties.

7. The semiconductor light-emitting device according to claim 6, wherein said element having said donor properties is an element belonging to Group IV or VI.

8. The semiconductor light-emitting device according to claim 6, wherein said element having said acceptor properties is an element belonging to Group II or IV.

* * * * *